United States Patent
Wald

(10) Patent No.: US 7,956,613 B2
(45) Date of Patent: Jun. 7, 2011

(54) METHOD FOR IMAGING ACOUSTICALLY INDUCED ROTARY SATURATION WITH A MAGNETIC RESONANCE IMAGING SYSTEM

(75) Inventor: Lawrence L. Wald, Cambridge, MA (US)

(73) Assignee: The General Hospital Corporation, Boston, MA (US)

( * ) Notice: Subject to any disclaimer, the term of this patent is extended or adjusted under 35 U.S.C. 154(b) by 208 days.

(21) Appl. No.: 12/435,164

(22) Filed: May 4, 2009

(65) Prior Publication Data

US 2010/0026298 A1 Feb. 4, 2010

Related U.S. Application Data

(60) Provisional application No. 61/049,933, filed on May 2, 2008.

(51) Int. Cl.
*G01V 3/00* (2006.01)
(52) U.S. Cl. .................... 324/309; 324/307
(58) Field of Classification Search .......... 324/300–322; 600/407–445
See application file for complete search history.

(56) References Cited

U.S. PATENT DOCUMENTS

| | | | | |
|---|---|---|---|---|
| 5,099,206 A * | 3/1992 | Imaizumi et al. | ............. | 324/307 |
| 5,170,120 A * | 12/1992 | Barbara et al. | ................ | 324/307 |
| 5,944,663 A * | 8/1999 | Kuth et al. | .................... | 600/411 |
| 6,486,669 B1 * | 11/2002 | Sinkus et al. | ................ | 324/307 |
| 6,836,114 B2 * | 12/2004 | Reddy et al. | ................. | 324/307 |
| 6,841,995 B2 * | 1/2005 | Weitekamp | .................. | 324/300 |
| 7,025,253 B2 * | 4/2006 | Sinkus et al. | ................ | 324/309 |
| 7,115,094 B2 * | 10/2006 | Azuma et al. | ................ | 600/459 |
| 2008/0255444 A1 * | 10/2008 | Li | ................ | 600/411 |
| 2009/0123384 A1 * | 5/2009 | Wald et al. | .................... | 424/9.32 |
| 2010/0176810 A1 * | 7/2010 | Bolster, Jr. | .................... | 324/309 |
| 2010/0267781 A1 * | 10/2010 | Pellechia | ...................... | 514/367 |

* cited by examiner

*Primary Examiner* — Brij B Shrivastav
(74) *Attorney, Agent, or Firm* — Quarles & Brady LLP

(57) ABSTRACT

A method for producing a magnetic resonance image indicative of mechanical waves applied to a subject is provided. Mechanical waves are applied to the subject at a selected frequency to induce oscillatory motion in tissues within the subject at the same frequency. A spin-lock radiofrequency pulse, having a resonance frequency matched to that of the induced oscillatory motion, is applied to the subject. This results in a spin-lock condition, during which transverse magnetization experiences rotary saturation resulting from magnetic field fluctuations produced by the oscillatory motion. Image data is acquired from the saturated transverse magnetization and images are reconstructed. As a result of the rotary saturation, these images exhibit darkening in those voxel locations affected by the oscillatory motion. In this manner, an image indicative of the applied mechanical waves is produced.

15 Claims, 8 Drawing Sheets

METHOD FOR IMAGING ACOUSTICALLY INDUCED ROTARY SATURATION WITH A MAGNETIC RESONANCE IMAGING SYSTEM

CROSS-REFERENCE TO RELATED APPLICATIONS

This application is based on, fully incorporates herein by reference, and claims the benefit of U.S. Provisional Patent Application Ser. No. 61/049,933, filed on May 2, 2008, and entitled "Method for Imaging Acoustically Induced Rotary Saturation with a Magnetic Resonance Imaging System".

BACKGROUND OF THE INVENTION

The field of the invention is magnetic resonance imaging and systems. More particularly, the invention relates to a method for producing MR images having an image contrast provided by rotary saturation of MR signals that is induced by the application of mechanical waves to a subject.

When a substance such as human tissue is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_{xy}$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically proven pulse sequences and they also enable the development of new pulse sequences.

The MR signals acquired with an MRI system are signal samples of the subject of the examination in Fourier space, or what is often referred to in the art as "k-space". Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp", a "Fourier", a "rectilinear", or a "Cartesian" scan. The spin-warp scan technique employs a variable amplitude phase encoding magnetic field gradient pulse prior to the acquisition of MR spin-echo signals to phase encode spatial information in the direction of this gradient. In a two-dimensional implementation ("2DFT"), for example, spatial information is encoded in one direction by applying a phase encoding gradient, $G_y$, along that direction, and then a spin-echo signal is acquired in the presence of a readout magnetic field gradient, $G_x$, in a direction orthogonal to the phase encoding direction. The readout gradient present during the spin-echo acquisition encodes spatial information in the orthogonal direction. In a typical 2DFT pulse sequence, the magnitude of the phase encoding gradient pulse, $G_y$, is incremented, $\Delta G_y$, in the sequence of measurement cycles, or "views" that are acquired during the scan to produce a set of k-space MR data from which an entire image can be reconstructed.

There are many other k-space sampling patterns used by MRI systems These include "radial", or "projection reconstruction" scans in which k-space is sampled as a set of radial sampling trajectories extending from the center of k-space. The pulse sequences for a radial scan are characterized by the lack of a phase encoding gradient and the presence of a readout gradient that changes direction from one pulse sequence view to the next. There are also many k-space sampling methods that are closely related to the radial scan and that sample along a curved k-space sampling trajectory rather than the straight line radial trajectory.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then perform a 2DFT or 3DFT on the regridded k-space data set. In the alternative, a radial k-space data set can also be transformed to Radon space by performing a 1DFT of each radial projection view and then transforming the Radon space data set to image space by performing a filtered backprojection.

In recent years, MRI has been increasingly employed to guide interventional medical treatment procedures. Exemplary procedures include MR-guided focused ultrasound, biopsies, cryoablation, and laser, radiofrequency ("RF"), or microwave thermal ablation. In these MR-guided procedures, the MRI system produces images that depict the anatomy of the subject being treated and also the location of the medical instrument used to perform the treatment. Additionally, other images such as temperature maps that indicate the amount of thermal energy imparted to tissues during, for example, an RF ablation procedure, can be produced. These anatomical and other images are produced in real-time as treatment is performed, thereby assisting the physician in physically guiding the instrument into proper position.

Magnetic resonance guided high intensity focused ultrasound ("MRgFUS") ablation is an attractive, non-invasive method that selectively ablates deep-lying tissue. The therapeutic value of this alternative surgical technique, however, depends on the accuracy of the imaging methods utilized to monitor the deposition of thermal energy to the target and surrounding tissues. There are several MR imaging techniques for measuring temperature change, including those that use $T_1$-weighted imaging, diffusion weighted imaging, and water proton resonance frequency ("WPRF") imaging based methods. Among these different temperature-imaging methods, WPRF temperature imaging is the commonly preferred technique for MRgFUS ablation therapy. In WPRF temperature imaging, temperature changes are calculated from phase difference images, usually acquired using a fast gradient echo sequence performed before and after FUS sonication. Several studies have demonstrated that WPRF temperature imaging can be used to accurately monitor temperature change in vivo in muscle tissue during MRgFUS ablation treatment.

While it is useful to monitor temperature changes in regions that have already been heated during MRgFUS ablation treatment, a method that allows the direct visualization of the ultrasound focus before heating would be similarly valuable. For example, in some applications, such as FUS treatment of the brain, the array of ultrasound sources must be properly tuned. However, this process is difficult due to phase shifts in the FUS beam that are induced by the skull. Therefore, it would be highly advantageous for the clinician to be able to determine the quality of the FUS beam focus in a target region non-invasively, and to do so at low power. Additional uses for MRgFUS include opening the blood-brain-barrier for the delivery of pharmaceutical agents to brain tissues. Such methods hold promise in gene therapy treatments. In these applications it would be likewise advantageous to non-invasively determine the focus of the FUS beam at a low power and prior to performing the treatment procedure. When performing MRgFUS on the brain, it is important to ensure that the focus of the FUS beam is properly set, so that thermal energy is not imparted to unwanted regions of healthy tissue or critical brain structures. Therefore, it is important to be able to properly and accurately identify the regions affected by the sonication.

It has been found that MR imaging can be enhanced when an oscillating stress is applied to the object being imaged in a method called MR elastography ("MRE"). The method requires that the oscillating stress produce shear waves that propagate through the organ, or tissues to be imaged. These shear waves alter the phase of the MR signals, and from this, the mechanical properties of the subject can be determined. In many applications, the production of shear waves in the tissues is a matter of physically vibrating the surface of the subject with an electromechanical device. The gradients employed in MRE must be modulated at the same frequency as the applied stress and the rate at which magnetic gradient fields can be modulated is limited. This limits the practical use of MRE to the application of low frequency oscillatory stresses, which are of little use for imaging the effects of the higher frequencies present in FUS procedures.

It would therefore be desirable to provide a method for non-invasively imaging the presence of a mechanical oscillation imparted to a subject, in which the mechanical oscillation has a relatively high frequency. Such a method would be applicable to image the effects of magnetic resonance guided focused ultrasound ("MRgFUS") procedures, and could specifically be employed to determine the accuracy of the FUS ultrasound beam focus in a target region.

SUMMARY OF THE INVENTION

The present invention overcomes the aforementioned drawbacks by providing an imaging method that non-invasively visualizes the effect of sound and ultrasound waves in a subject with magnetic resonance imaging ("MRI"). More particularly, image data is acquired by a pulse sequence that is sensitive to magnetic field fluctuations in a subject produced by the application of mechanical waves thereto. The method employs a rotary saturation effect produced by the pulse sequence, which is sensitive to these magnetic field fluctuations. For example, a spin-lock preparation is employed to induce the rotary saturation. The pulse sequence employed when practicing the present invention is tuned to be resonantly sensitive to magnetic field modulations at the frequency of the magnetic field fluctuations. Where the mechanical waves are present at sufficient amplitude, and there exist magnetic particles or structures that are free to vibrate with the mechanical wave field, the reconstructed images will reflect the induced rotary saturation mechanism.

It is an aspect of the invention to provide a method for the direct visualization of a high intensity focused ultrasound ("FUS") field that is applied to a subject during an interventional procedure. The FUS induces oscillatory motion in the subject that, with the properly matched spin-lock RF field, results in rotary saturation of the detected MR signals. This loss of MR signal provides an image contrast mechanism indicative of the location and extent of the oscillatory motion induced by the applied FUS.

It is another aspect of the invention to provide a method for updating a magnetic resonance guided FUS ("MRgFUS") treatment plan by imaging the location and extent of a mechanical wave field produced in a subject by an ultrasound transducer at low power. Direct visualization of the FUS field at a low power allows the focus to be optimized before significant heat is created through the performance of the interventional procedure.

It is yet another aspect of the invention to provide a method for further enhacing the image contrast effects of contrast agents through the resonant application of mechanical waves. Rather than having to design an agent that has some intrinsic vibratory motion at a desired frequency, any contrast agent can be vibrated at the correct frequency with applied sound waves. The present invention allows the exploration of the mechanical environment of the contrast agent since the mechanical Young's modulus of the agent's mechanical environment and the mass of the agent determine the amplitude of the contrast agent's displacement to a mechanical wave having a given frequency. Proper choice of the mechanical wave frequency therefore allows a mechanical resonance amplification. Further, the method of the present invention allows the tuning of an MR imaging procedure to be sensitive to a particular contrast agent and an agent in a particular environment. For example, when a heavy iron-oxide contrast agent is present in a mechanical milieu, it possesses a characteristic vibrational frequency based on the contrast agent's mass and the Young's modulus of its surrounding environment.

It is yet another aspect of the invention to provide a method for acoustic spectroscopy of the environment surrounding a contrast agent (or endogenous source) by sweeping an applied mechanical wave field through a plurality of frequencies (with a matching sweep of $\omega_{SL}$). Each unique combination of particle mass and local Young's modulus will produce a spectral peak. Sweeping a sound or modulated ultrasound frequency along with the appropriately tuned rotary saturation sequence will provide a form of spectroscopy to differentiate between different environments. Conversely the spectrum can differentiate different contrast agents (by mass), or different cellular structures if the magnetic object is endogenous.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
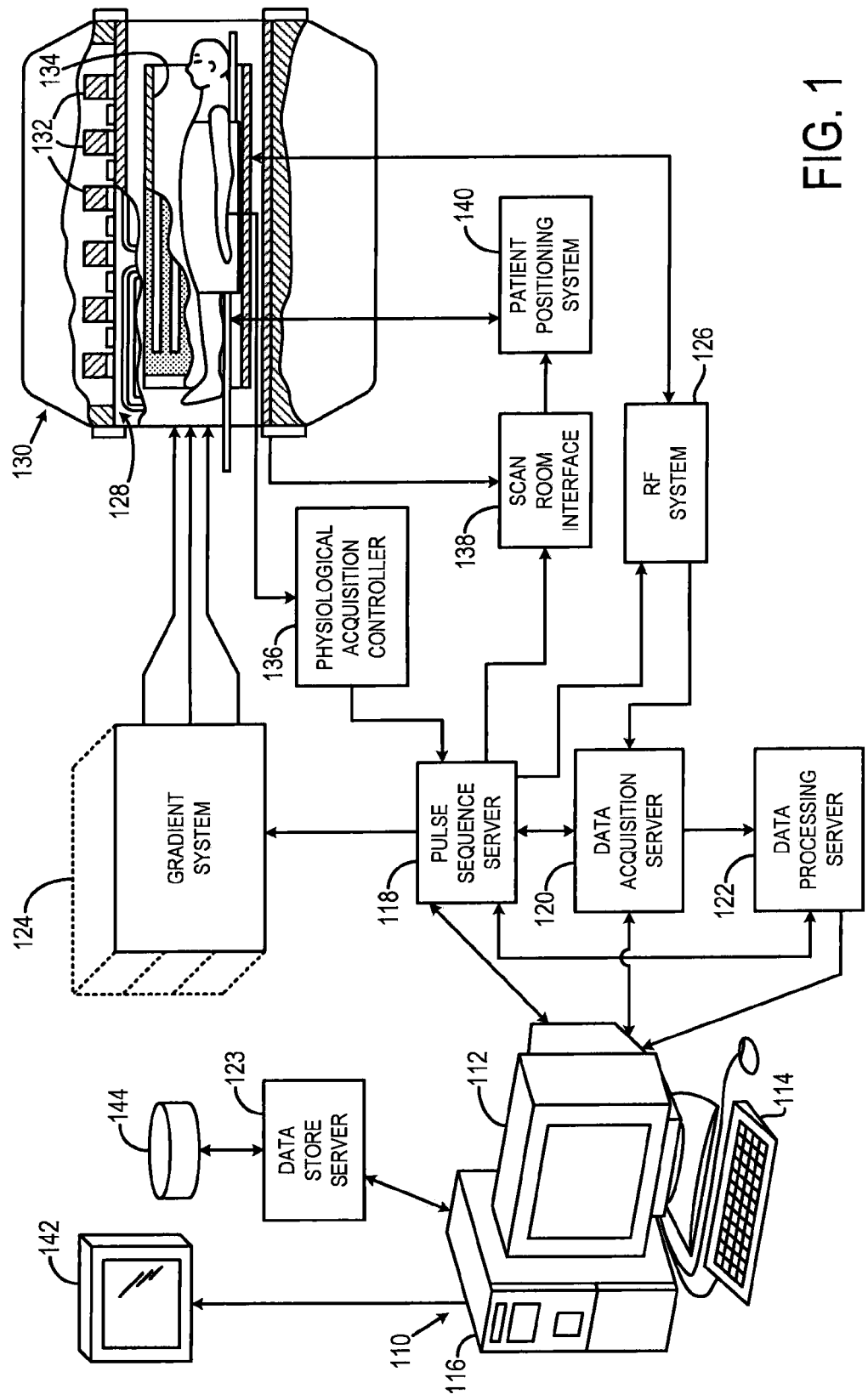
FIG. 1 is a block diagram of an MRI system that employs the present invention.

As used herein, the term "mechanical wave field" refers generally to at least one mechanical wave propagating in a fluid medium. Exemplary mechanical wave fields include those produced by ultrasound transducers, driver devices, such as magnetic resonance elastography ("MRE") driver devices, and the like.

The principle of magnetic resonance ("MR") rotary saturation is a phenomena described in solids and liquids, for example, by A. G. Redfield in "Nuclear Magnetic Resonance Saturation and Rotary Saturation in Solids," *Phys. Rev.*, 1955; 98(6):1787-1809. The rotary saturation effect manipulates the nuclear spin magnetization while it is rendered stationary, or "spin-locked," in a rotating frame of reference. In methods that exploit the spin-locking principle, longitudinal magnetization, which is in equilibrium and aligned along the direction of the static magnetic field, $B_0$, is first flipped into a transverse plane through the application of a 90 degree radiofrequency ("RF") excitation pulse. Once in the transverse plane, the magnetization is stationary when viewed in a frame of reference with which it rotates: the so-called "rotating frame". In the laboratory frame, a conventional free induction decay ("FID") is observed after the application of the RF excitation pulse. However, when spin-locking is employed, a second resonant RF excitation pulse is applied along the direction of the magnetization in the rotating frame to establish the so-called "spin-lock RF field," $B_{1\rho}$.

While the spin-lock field, $B_{1\rho}$, is applied, the magnetization is seen to be stationary in the rotating frame since it is aligned along $B_{1\rho}$, which is also stationary in the rotating frame. Thus, the magnetization is effectively in equilibrium with respect to the rotating frame in analogy to the situation in the laboratory frame prior to excitation where longitudinal magnetization is aligned along $B_0$. The magnitude of the spin-locked magnetization can be observed by simply turning off the spin-lock field, $B_{1\rho}$, and measuring the amplitude of the resulting FID. Alternatively, the $B_{1\rho}$ field can be turned off, and the magnetization in the transverse plane flipped back up to the longitudinal axis by a 90 degree RF excitation pulse for subsequent sampling with a standard MR data acquisition methods. In both of these approaches, the period of time during which spin-locking is applied is referred to "spin-lock preparation".

Since spin-locked magnetization is created by $B_0$, it is much larger than the small spin-lock field, $B_{1\rho}$, would be able to create through true Boltzmann polarization alone. In this manner, the spin-locked magnetization is in equilibrium in direction, but not in magnitude. As a result it will eventually relax to a much smaller value, although still aligned with $B_{1\rho}$. This relaxation in the rotating frame has a characteristic relaxation time, $T_{1\rho}$. Typical in vivo values for $T_{1\rho}$ are hundreds of milliseconds, so the spin-locked state can last for several hundred milliseconds without substantial loss of magnetization. The mechanisms for $T_{1\rho}$ relaxation are analogous to normal longitudinal relaxation time, $T_1$, relaxation. Namely, random magnetic fields fluctuating at the Larmor frequency and orthogonal to the equilibrium magnetization. While fluctuating fields in the plane transverse to the main magnetic field, $B_0$, cause $T_1$ relaxation in conventional $T_1$ methods, fluctuating fields in the plane transverse to the spin-lock field, $B_{1\rho}$, cause $T_{1\rho}$ relaxation in spin-locking methods. An alternate view of rotary saturation is to view the resonant rotary saturation field established, for example, by oscillations in the local magnetic field environment, as an effective RF excitation field in the rotating frame. Thus, the rotary saturation field serves to resonantly rotate the spin-locked magnetization away from the spin-lock field, $B_{1\rho}$, in a manner analogous to a conventional RF field rotating longitudinal magnetization away from the static field, $B_0$. When rotated away from the spin-lock field, that rotated component of the spin-locked magnetization is subject to dephasing by $T_2^*$ relaxation, which in turn reduces the intensity of detectable MR signals.

Since the equivalent of the Larmor precession frequency in the spin-locked state is proportional to $B_{1\rho}$, the proper frequency for efficient saturation of spin-locked magnetization is orders of magnitude lower in frequency than that needed for normal $T_1$ relaxation.

In the spin-lock state, nuclear spins experience longitudinal and transverse relaxation from external magnetic fields, characterized by the relaxation time constants $T_{1\rho}$ and $T_{2\rho}$. These external magnetic fields are produced, for example, by fluctuations in the electromagnetic environment within the subject to be imaged. For example, the magnetic fields that are responsible for $T_{1\rho}$ and $T_{2\rho}$ relaxation can be created by applying an mechanical wave field to the subject. Magnetic field fluctuations that are present during the spin-locking period, and with a significant spectral density at the Larmor frequency in the rotating frame, result in resonant longitudinal relaxation of the transverse magnetization in the spin-lock state. In this manner, $T_{1\rho}$ of the magnetization is shortened relative to its normal, or resting state, value and, therefore, the spin-locked magnetization is reduced. In particular, the Larmor frequency in the rotating frame, $\omega_R$, is given by:

$$\omega_R = \gamma B_{1\rho} \qquad \text{Eqn. (1)};$$

where $\gamma$ is the gyromagnetic ratio of the nuclear spin species to be imaged, and $B_{1\rho}$ is the applied spin-lock RF field. The amplitude of the applied field $B_{1\rho}$ is set to produce the resonance frequency, $\omega_R$, at the applied frequency of the mechanical wave field in order to sensitize the measurement or MR signals to the oscillatory motion induced in the magnetic field environment by the mechanical wave field.

Thus, to practice the present invention a subject or patient is placed in a conventional magnetic resonance imaging ("MRI") system and a pulse sequence that establishes spin-locked magnetization is employed. When a conventional MRI system is employed, an external driver system is utilized to impart mechanical waves to the subject. It will be appreciated by those skilled in the art that exemplary driver systems include those readily applicable to magnetic resonance elastography ("MRE") methods. However, as will be described below, alternative configurations of an MRI system can also be employed.

Magnetic Resonance Imaging (MRI) Systems

Referring particularly now to FIG. 1, the invention is employed in an MRI system. The MRI system includes a workstation 110 having a display 112 and a keyboard 114. The workstation 110 includes a processor 116 that is a commercially available programmable machine running a commercially available operating system. The workstation 110 provides the operator interface that enables scan prescriptions to be entered into the MRI system. The workstation 110 is coupled to four servers: a pulse sequence server 118; a data acquisition server 120; a data processing server 122, and a data store server 123. The workstation 110 and each server 118, 120, 122 and 123 are connected to communicate with each other.

The pulse sequence server 118 functions in response to instructions downloaded from the workstation 110 to operate a gradient system 124 and an RF system 126. Gradient waveforms necessary to perform the prescribed scan are produced and applied to the gradient system 124 that excites gradient coils in an assembly 128 to produce the magnetic field gradients $G_x$, $G_y$, and $G_z$ used for position encoding MR signals. The gradient coil assembly 128 forms part of a magnet assembly 130 that includes a polarizing magnet 132 and a whole-body RF coil 134.

RF excitation waveforms are applied to the RF coil 134 by the RF system 126 to perform the prescribed magnetic resonance pulse sequence. Responsive MR signals detected by the RF coil 134 or a separate local coil (not shown in FIG. 1) are received by the RF system 126, amplified, demodulated, filtered and digitized under direction of commands produced by the pulse sequence server 118. The RF system 126 includes an RF transmitter for producing a wide variety of RF pulses used in MR pulse sequences. The RF transmitter is responsive to the scan prescription and direction from the pulse sequence server 118 to produce RF pulses of the desired frequency, phase and pulse amplitude waveform. The generated RF pulses may be applied to the whole body RF coil 134 or to one or more local coils or coil arrays (not shown in FIG. 1).

The RF system 126 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2}$$ Eqn. (2);

and the phase of the received MR signal may also be determined:

$$\phi = \tan^{-1}\left(\frac{Q}{I}\right).$$ Eqn. (3)

The pulse sequence server 118 also optionally receives patient data from a physiological acquisition controller 136. The controller 136 receives signals from a number of different sensors connected to the patient, such as ECG signals from electrodes or respiratory signals from a bellows. Such signals are typically used by the pulse sequence server 118 to synchronize, or "gate", the performance of the scan with the subject's respiration or heart beat.

The pulse sequence server 118 also connects to a scan room interface circuit 138 that receives signals from various sensors associated with the condition of the patient and the magnet system. It is also through the scan room interface circuit 138 that a patient positioning system 140 receives commands to move the patient to desired positions during the scan.

The digitized MR signal samples produced by the RF system 126 are received by the data acquisition server 120. The data acquisition server 120 operates in response to instructions downloaded from the workstation 110 to receive the real-time MR data and provide buffer storage such that no data is lost by data overrun. In some scans the data acquisition server 120 does little more than pass the acquired MR data to the data processor server 122. However, in scans that require information derived from acquired MR data to control the further performance of the scan, the data acquisition server 120 is programmed to produce such information and convey it to the pulse sequence server 118. For example, during prescans MR data is acquired and used to calibrate the pulse sequence performed by the pulse sequence server 118. Also, navigator signals may be acquired during a scan and used to adjust RF or gradient system operating parameters or to control the view order in which k-space is sampled. And, the data acquisition server 120 may be employed to process MR signals used to detect the arrival of contrast agent in a magnetic resonance angiography ("MRA") scan. In all these examples the data acquisition server 120 acquires MR data and processes it in real-time to produce information that is used to control the scan.

The data processing server 122 receives MR data from the data acquisition server 120 and processes it in accordance with instructions downloaded from the workstation 110. Such processing may include, for example: Fourier transformation of raw k-space MR data to produce two or three-dimensional images; the application of filters to a reconstructed image; the performance of a backprojection image reconstruction of acquired MR data; the calculation of functional MR images; the calculation of motion or flow images, etc.

Images reconstructed by the data processing server 122 are conveyed back to the workstation 110 where they are stored. Real-time images are stored in a data base memory cache (not shown) from which they may be output to operator display 112 or a display 142 that is located near the magnet assembly 130 for use by attending physicians. Batch mode images or selected real time images are stored in a host database on disc storage 144. When such images have been reconstructed and transferred to storage, the data processing server 122 notifies the data store server 123 on the workstation 110. The workstation 110 may be used by an operator to archive the images, produce films, or send the images via a network to other facilities.

Figure 2:
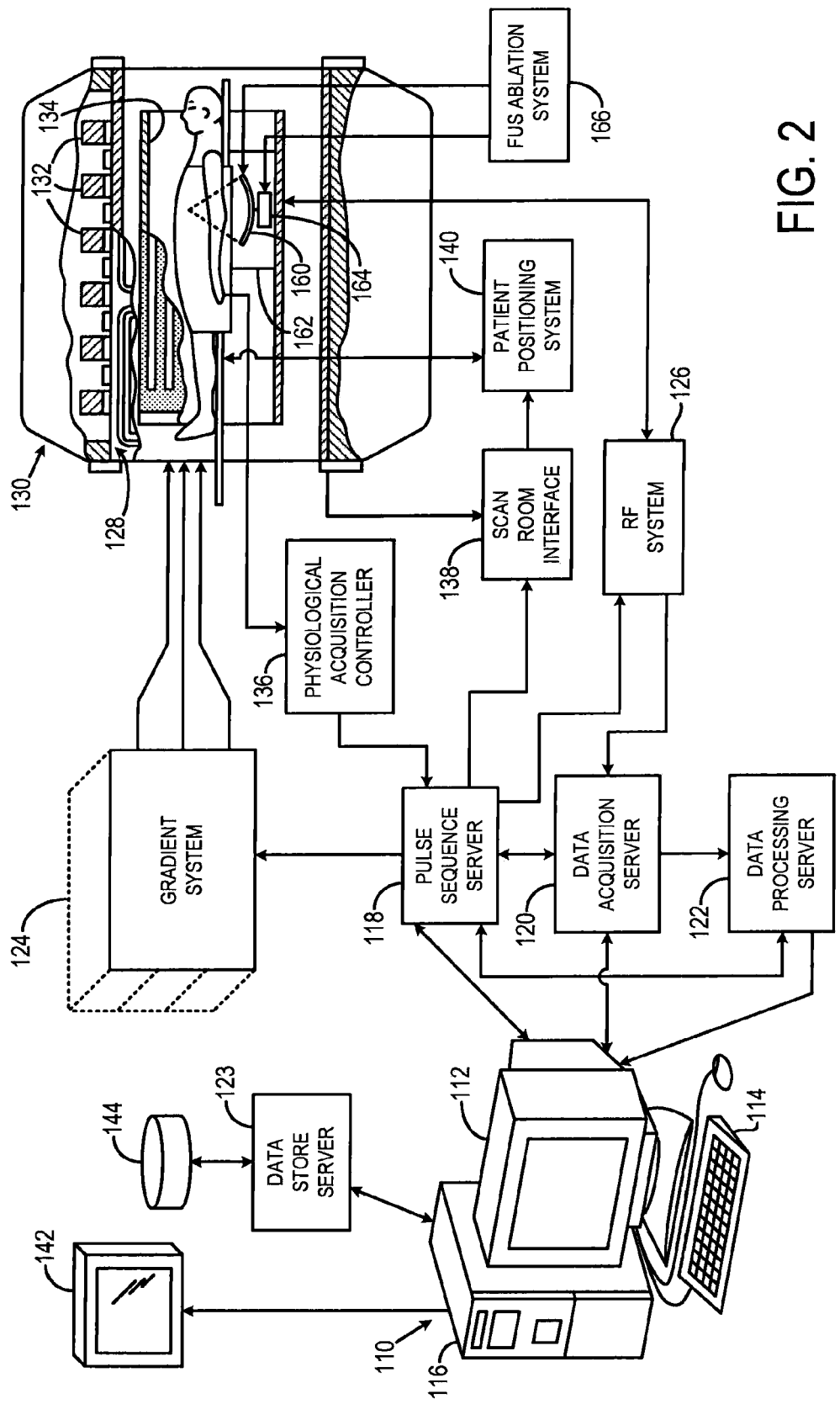
FIG. 2 is a block diagram of another configuration of an MRI system that employs the present invention.

While a conventional MRI system, such as the one described above, may be used to implement the invention, another configuration of an MRI system that includes a patient table with an integrated ultrasound transducer 160, can also be employed, as shown in FIG. 2. The ultrasound transducer 160 is operable to perform thermal ablation on a subject to treat, for example, a benign or cancerous tumor, or uterine fibroids. The ultrasound transducer 160 includes an array of ultrasound transducer elements that are arrayed, for example, similar to the systems described in U.S. Pat. Nos. 6,613,004 and 6,735,461.

The ultrasound transducer 160 is housed in a housing 162 that is filled with an acoustically conductive fluid, such as degassed water or a similar acoustically transmitting fluid. The ultrasound transducer 160 is preferably connected to a positioning system 164 that moves the transducer 160 within the housing 162, and consequently mechanically adjusts the focal zone of the transducer 160. For example, the positioning system 164 may be configured to move the transducer 160 within the housing 162 in any one of three orthogonal directions and to pivot the transducer 160 about a fixed point within the housing 162 to change the angle of the transducer 160 with respect to a horizontal plane. When the angle of the transducer 160 is altered, the focal distance of the focal zone is controlled electronically by changing the phase and/or amplitude of the drive signals provided to the transducer 160, as described, for example, in U.S. Pat. No. 6,613,004. These drive signals are provided to the ultrasound transducer by an FUS ablation system 166 that includes drive circuitry in communication with the ultrasound transducer 160 and a controller that is in communication with the positioning system 164 and drive circuitry.

The top of the housing 162 includes a flexible membrane that is substantially transparent to ultrasound, such as a Mylar, polyvinyl chloride ("PVC"), or other plastic materials. In addition, a fluid-filled bag (not shown) is generally provided along the top of the patient table that can conform easily to the contours of a patient placed on the table.

Figure 3:
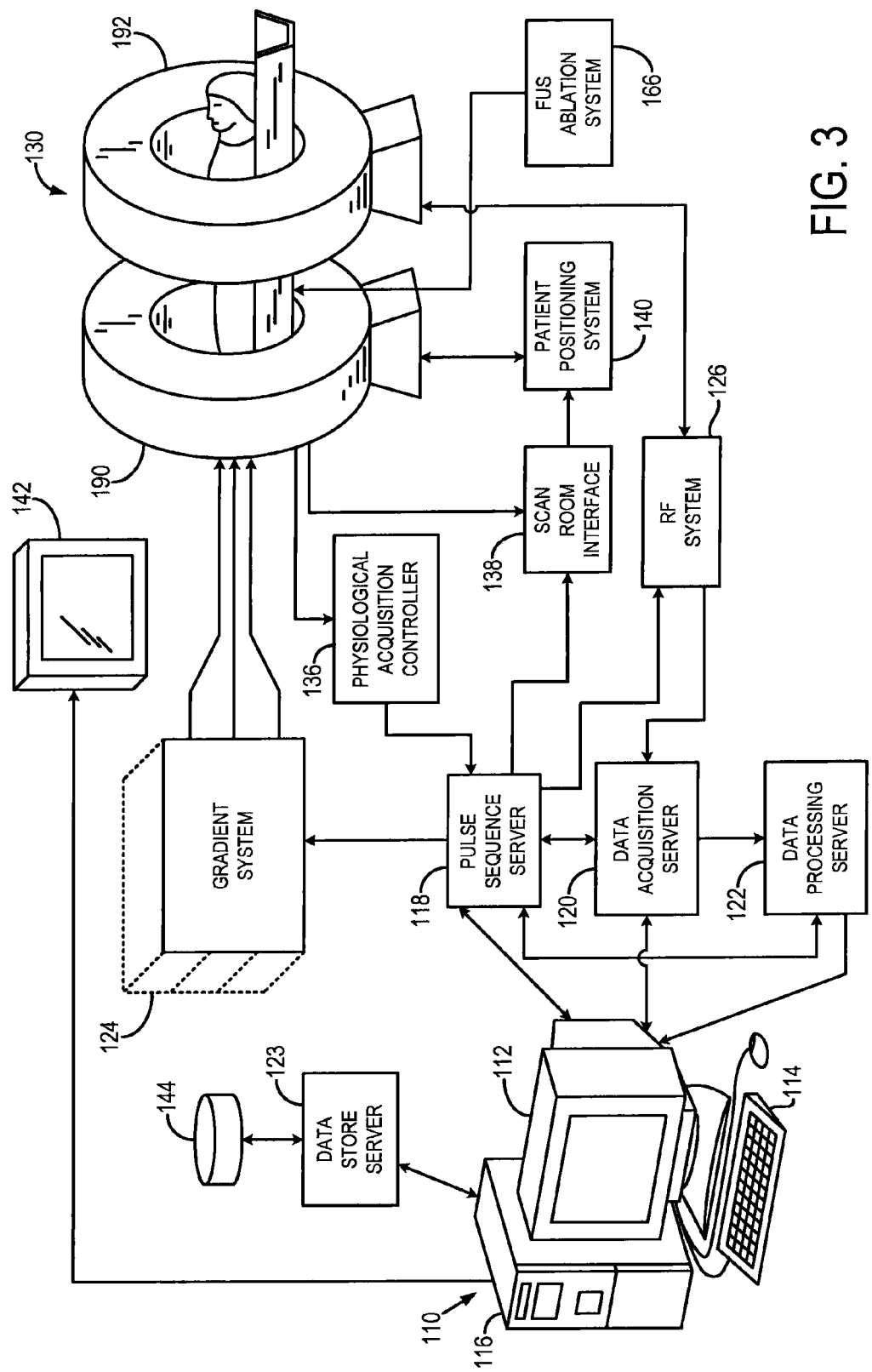
FIG. 3 is a block diagram of yet another configuration of an MRI system that employs the present invention.

While a conventional MRI system, or an MRI system that employs a patient table with an integrated ultrasound transducer, such as those described above, may be used to implement the invention, another configuration of an MRI system, which is designed to allow access by a physician, can also be employed. Referring particularly to FIG. 3, when an intraoperative MR imaging procedure is conducted a patient is placed in the magnet system 130 and a region of interest in the patient is aligned near the system isocenter located between the two, spaced magnet rings 190 and 192. A physician standing between magnet rings 190 and 192 has unrestricted access to the region of interest in the patient. During the procedure the patient may move, or be moved by the physician. An ultrasonic transducer (not shown) connected to a focused ultrasound ("FUS") ablation system 166 may be manipulated by the physician to treat a selected region of the patient and the images produced on display 142 may be used by the physician to help aim the ablation device and to determine when treatment is completed.

It will become apparent from the following description that any of the above described MRI systems can be employed when practicing the present invention, with the choice of MRI system related to the particular application at hand. For example, when utilizing the present invention to aid in the planning of, or patient monitoring during, an MRgFUS procedure, the MRI system of FIGS. 2 and 3 may be employed. On the other hand, when utilizing the present invention to enhance the effects of an MR contrast agent, or when performing acoustic spectroscopy, the MRI system of FIGS. 1 and 3 may be employed.

Exemplary Pulse Sequence

An exemplary MRI pulse sequence used to acquire image data in accordance with the present invention includes a preparatory portion that places the nuclear spin magnetization used for MR imaging in a spin-locked state and a data acquisition portion. The preparatory portion includes, for example, the application of a 90 degree slice-selective, or non-selective, radiofrequency ("RF") pulse to tip magnetization from the equilibrium longitudinal axis into the transverse plane, which is followed immediately by the application of a resonant RF pulse with a phase chosen so that the produced RF field is along the same axis as the spins in the rotating frame, for example, aligned with $B_{1\rho}$. The preparatory portion can also include a spin-lock preparation pulse method to achieve the spin-locked state, such as described, for example, by A. Borthakur, et al., in "A Pulse Sequence for Rapid In Vivo Spin-Locked MRI," *JMRI*, 2006; 23(4):591-6. In one embodiment of the present invention, the spins are held in the spin-locked state for a selected period of time, $T_{SL}$.

As mentioned above, the preparatory spin-lock period is followed by an image encoding period where image data is acquired using, for example, a single or multishot EPI or spiral readout trajectory. It should be apparent to one having ordinary skill in the art that any readout trajectory can be used to acquire image data. Moreover, it should be apparent that methods such as parallel acquisition can similarly be included to accelerate imaging.

Figure 4:
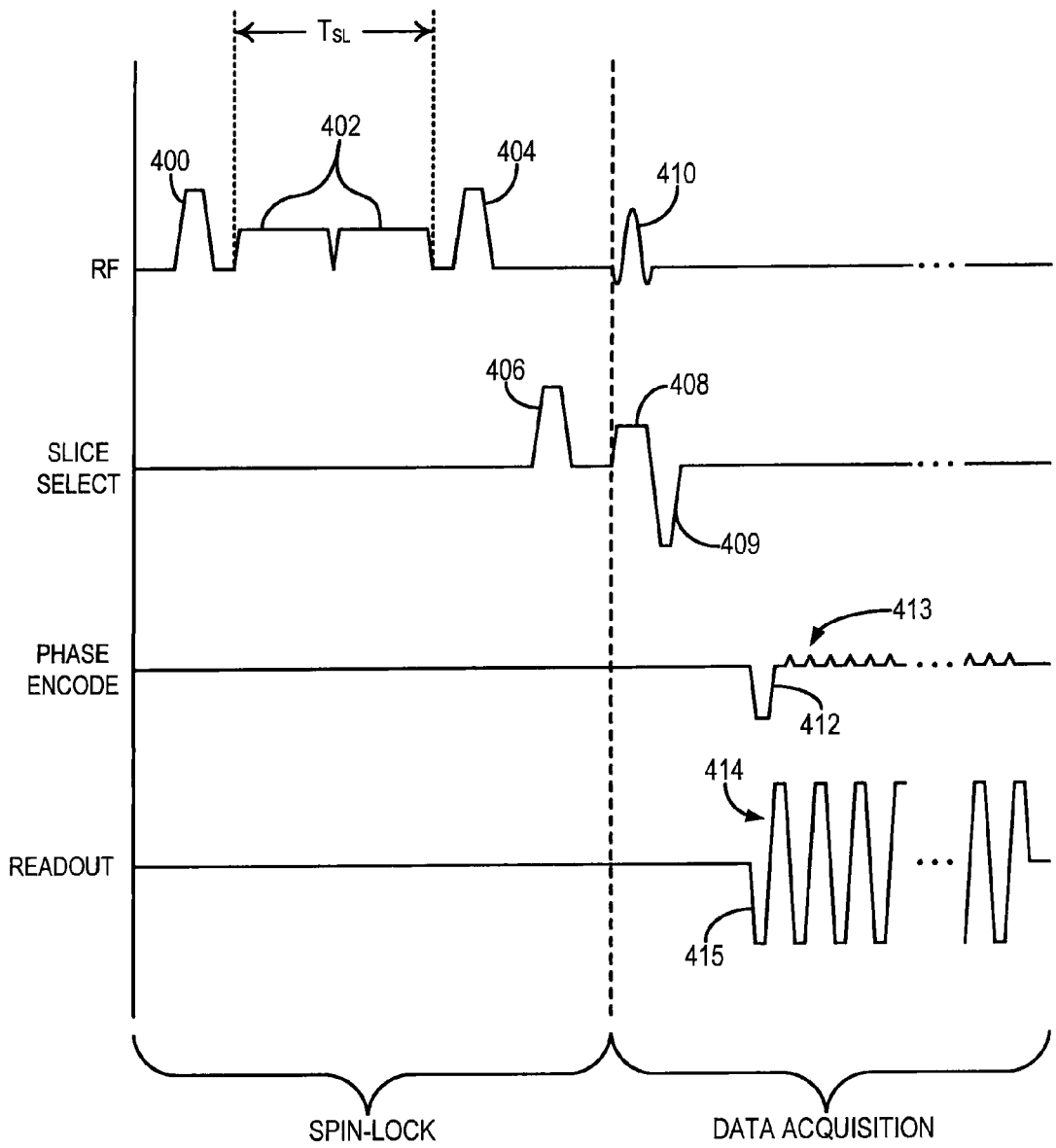
FIG. 4 is a graphic representation of a pulse sequence performed by the MRI system of FIGS. 1, 2, and 3 to practice the present invention.

Referring particularly now to FIG. 4, an exemplary pulse sequence used to practice the present invention includes a spin-lock preparatory portion followed by a data acquisition portion, such as, for example, an echo-planar imaging ("EPI") readout. The spin-lock portion includes a nonselective 90 degree radiofrequency ("RF") pulse 400 that excites spins, which are subsequently spin-locked in the transverse plane by the application of two phase-alternating spin-lock ("SL") RF pulses 402. The SL pulses 402 are phase-shifted +90 degrees and −90 degrees from the phase of the first 90 degree RF pulse 400. These phase-alternated SL pulses 402 act to reduce image artifacts that would otherwise result from $B_1$ field inhomogeneities. The duration of the SL pulses 402 is denoted as $T_{SL}$, and their amplitude determines the $B_{1\rho}$ field that is produced during the spin-lock condition. The amplitude of the SL pulses 402 is set such that the Larmor frequency in the rotating frame ($\omega_R = \gamma B_{1\rho}$) corresponds to the frequency of the applied mechanical wave field, and therefore, the frequency of the magnetic field oscillations induced by the mechanical wave field. A second nonselective 90 degree RF pulse 404 restores the spin-locked magnetization to the longitudinal axis. High amplitude crusher gradient pulses 406 are then applied to eliminate any unwanted residual transverse magnetization. The spin-locked, or "$T_{1\rho}$-prepared," longitudinal magnetization, $M(T_{SL})$, that exists after the application of the crusher gradients 406 is described by the equation:

$$M(T_{SL}) = M_0 e^{(-T_{SL}/T_{1\rho})}; \qquad \text{Eqn. (4)}$$

where $M_0$ is the thermal equilibrium longitudinal magnetization, $T_{SL}$ is the duration of the spin-lock pulses 402, and $T_{1\rho}$ is the longitudinal relaxation time in the rotating reference frame. With this preparation, the longitudinal magnetization has thus been modulated, or weighted, by changes in the $T_{1\rho}$ of the tissues being imaged that occurred during the spin-locking period.

For imaging the $T_{1\rho}$-prepared signal, a gradient-echo echo-planar imaging ("EPI") readout is used in which an excitation pulse 410 is applied in the presence of a slice select gradient 408 to produce transverse magnetization in a slice through the subject. The excited spins are rephased by a negative lobe 409 on the slice select gradient and then a time interval elapses before the readout sequence begins. A train of acquired NMR gradient recalled echoes are produced by the application of an oscillating readout gradient field 414. The readout sequence is started with a negative readout gradient lobe 415 and the echo signals are produced as the readout gradient oscillates between positive and negative values. Spatial encoding of the echoes is accomplished by a series of phase encoding gradient pulses 412. The first pulse is a negative lobe 413 that occurs before the echo signals are acquired to encode the first view with a negative k-space location. Subsequent phase encoding pulses 412 occur as the readout gradient pulses 414 switch polarity, and they step the phase encoding monotonically upward through k-space.

It should be appreciated by those skilled in the art that other imaging pulse sequence portions can be employed after the spin-lock magnetization preparation period, and that the spin-lock magnetization preparation period can be performed as an integral part of the imaging pulse sequence, or as a pulse sequence separate from the imaging sequence. In the former case the second RF pulse 404 and the crusher gradient 406 are not required and a separate RF excitation pulse is not required in the image acquisition pulse sequence that follows. In such a configuration, the imaging pulse sequence reads out the MR signal produced by the transverse magnetization at the completion of the SL pulses 402.

In general, local magnetic field fluctuations cause $T_{1\rho}$ relaxation of the transverse magnetization during the spin lock period when the resonant condition is met (i.e., when the magnetic field fluctuations oscillate with a frequency matched by the spin-lock frequency). This in turn causes the measured MR signal to decrease in locations where the local magnetic field fluctuations are present, which is consequently manifested as voxel darkening in reconstructed MR images. Alternatively, the $T_{1\rho}$ relaxation contrast phenomena can be described in terms of how the oscillating magnetic fields interact with the spin-locked magnetization. In this alternative physical description the fluctuating magnetic fields act similar to a conventional radiofrequency pulse by tipping the spin-locked magnetization away from its equilibrium position. This results in $T_2^*$ dephasing of the magnetization that is tipped, or rotated, away from the spin-locked magnetization that is aligned along $B_{1\rho}$. Both of these physical descriptions yield the same physical result, which will herein be referred to as $T_{1\rho}$ relaxation.

Time-varying magnetic field fluctuations induced by oscillatory motion of the tissues in a subject, as driven by mechanical waves, are employed as the rotary saturation field in accordance with the present invention. Because these fluctuating magnetic fields are present during the spin-locking phase of the pulse sequence, they can be exploited to produce an image contrast mechanism. The frequency spectrum of these oscillating magnetic fields has a spectral power density at the resonant frequency in the rotating frame of the spin-lock, $\omega_R = \gamma B_{1\rho}$. It is noted again that the spin-lock frequency, $\omega_R$, is controlled through the amplitude of $B_{1\rho}$, while the frequency of the applied mechanical waves is controlled either by setting the frequency of an oscillatory source in contact with the body, or by using a higher frequency carrier wave with an amplitude modulation at the spin-lock frequency.

As will be discussed below in detail, a scan is performed using the pulse sequence described above with reference to FIG. 4 and the acquired k-space data, or image data, is used to reconstruct an image in the usual fashion. The above-described rotary saturation effect results in an attenuation of the image intensity in the reconstructed images. Since the image gets darker as a result of rotary saturation, the locations of decreased signal intensity correspond to regions where magnetic sources of sufficient density and mechanical waves of sufficient amplitude and frequency coincide. It will be appreciated by those skilled in the art that routine anatomical images may be acquired to facilitate identifying locations of regions affected by rotary saturation.

Magnetic Resonance Guided Focused Ultrasound (MRgFUS)

Figure 5:
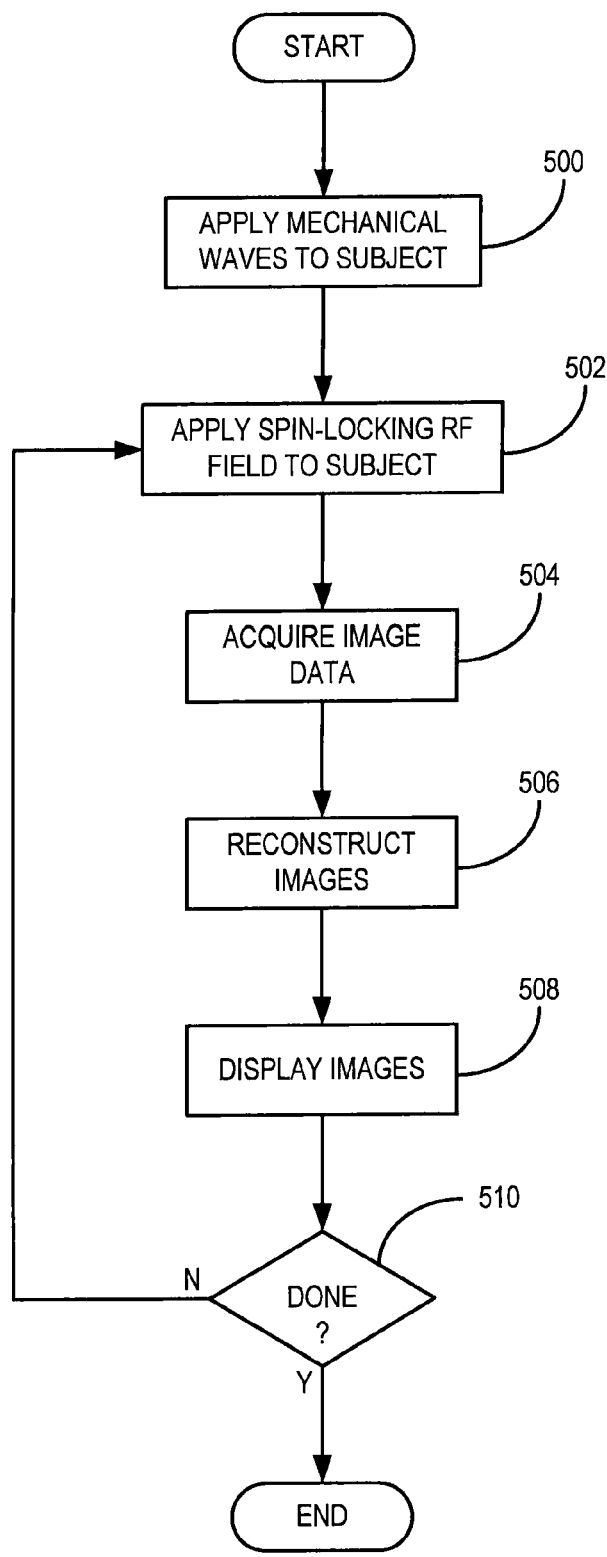
FIG. 5 is a flowchart setting forth the steps of a method for producing an image indicative of an mechanical wave field applied to a subject in accordance with the present invention.

Referring particularly now to FIG. 5, a method for producing an image indicative of a mechanical wave field in a subject begins by applying such a wave to the subject, as indicated at step 500. Exemplary mechanical wave fields include those produced by an ultrasound transducer. The ultrasound, which can be either ultrasound or amplitude modulated ultrasound, produces mechanical waves in the subject that in turn modulate the position of magnetic materials in the subject at the frequency of the applied ultrasound, or of its amplitude modulation. In the alternative, however, the mechanical wave field can also be produced, for example, by MRE drivers or other similar devices configured to induce vibratory motion in a subject. By way of these examples, an image indicative of the location and effective extent of the applied mechanical wave field in the subject is produced. Such an image is beneficial when monitoring the treatment of a subject with FUS to ensure that the focused ultrasound is substantially only applied to a desired target region and not to surrounding healthy tissues.

The imaging of the applied mechanical wave field therefore includes performing a pulse sequence that includes a spin-locking portion, such as the one described above with respect to FIG. 4. In this manner, a spin-locking radiofrequency ("RF") field is applied to the subject, as indicated at step 502. The spin-locking RF field, $B_{1\rho}$, is applied at a spin-locking resonance frequency, $\omega_R = \gamma B_{1\rho}$, that is matched to the frequency of the applied mechanical wave field. A region in the subject affected by the imparted mechanical wave field, and thereby oscillating at the frequency of the field, produces local magnetic field fluctuations that interact with spin-locked magnetization produced by the spin-locking RF field having a resonance frequency matched to the frequency of the mechanical wave field. Therefore, the regions in the subject receiving, for example, a focused ultrasound beam during a FUS ablation procedure will exhibit a reduction in the detectable MR signal via the rotary saturation induced in the spin-locked magnetization by the mechanical wave field (i.e., the FUS beam). These MR signals are acquired as image data in step 504, said image data being subsequently reconstructed to produce images indicative of the mechanical wave field in the subject, as indicated at step 506. These images are displayed in a real-time manner to the physician or other healthcare professional delivering the FUS treatment to the subject, as indicated at step 508. If the procedure is finished, the method is not repeated to refresh the images; however, if treatment is still be conducted, images are continuously refreshed by repeating steps 502-508, as decided at decision block 510.

Using the aforementioned method, a physician is able to noninvasively monitor the application of FUS treatment to a subject, thereby ensuring that focused ultrasound energy is only imparted to the desired target region, and not to surrounding tissues. In a different method, however, a treatment plan for an automated FUS treatment using, for example, the MRI system of FIG. 2 is established, or updated, using images produced in accordance with the present invention.

Figure 6:
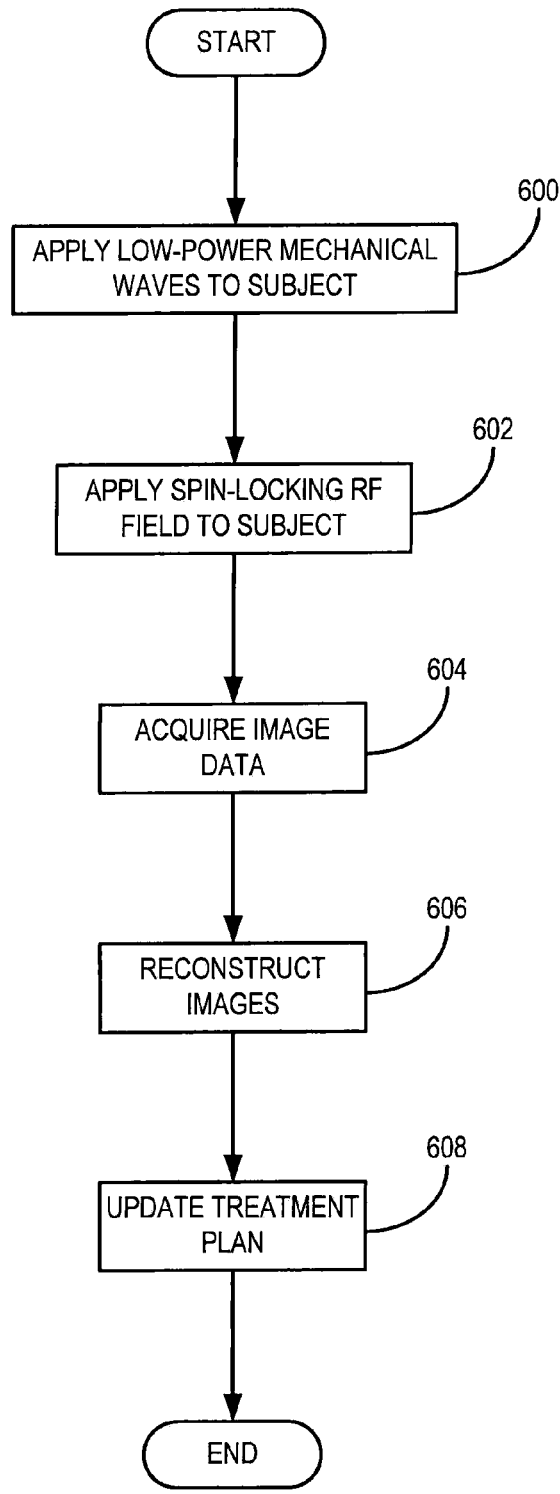
FIG. 6 is a flowchart setting forth the steps of a method for updating a magnetic resonance guided focused ultrasound ("MRgFUS") treatment plan by producing an image indicative of a low power FUS applied to a subject.

Referring particularly now to FIG. 6, such a method begins by applying a low power mechanical wave field, for example a low power FUS beam, to the subject, as indicated at step 600. Here, the objective is not to monitor the application of a mechanical wave field to a subject in real-time, but rather to establish that the mechanical wave field is applied to the proper locations in the first place. By way of example, direct visualization of a FUS field allows the focus to be optimized before significant heat is created through the performance of the interventional procedure, particularly in treatments of the brain where the skull presents challenges in accurately focusing the FUS beam. Similar to the aforementioned imaging method, a pulse sequence such as the one described with respect to FIG. 4 is employed to apply a spin-locking RF field to the subject, as indicated at step 602. The resonance frequency of this spin-locking RF field is matched to the frequency of the imparted low power mechanical wave field, such that a rotary saturation effect is established in the produced spin-locked magnetization. Image data is subsequently acquired, as indicated at step 604 and described above.

From the acquired image data, an image indicative of the applied low power mechanical wave field is reconstructed, as indicated at step 606. This image identifies the location and extent of the mechanical wave field as applied to the subject. In this manner, and again by way of example, a physician is able to visualize the focus of a FUS beam that is to be employed during an interventional procedure. By visualizing the focus of the beam in this manner, the physician can make appropriate changes to the treatment plan, as indicated at step 608, and without unduly exposing the subject to high intensity ultrasound energy. Exemplary updates to a focused ultrasound treatment plan include changing the spatial location of the focal point of the FUS beam and changing the amplitude and/or phase of the applied FUS beam so that a more accurate focus of the ultrasound energy is achieved.

Magnetic Resonance Contrast Agent Enhancement

Contrast agents, as well as endogenous contrast sources, are typically used "as is" in MRI. After their chemical design, there is no way to externally modulate the contrast agents or to externally sensitize them to different environments. Rather than designing a specific contrast agent that has some intrinsic vibratory motion at a desired frequency, any contrast agent can be vibrated at a selected frequency with applied mechanical waves. The Young's modulus and mass of the contrast agent determine the amplitude of its displacement in the presence of a mechanical wave field having a given frequency. Therefore, proper choice of the mechanical wave frequency allows a mechanical resonance amplification of the contrast agent's effect. Thereby, the method of the present invention allows the tuning of an MR imaging procedure to be sensitive to a particular contrast agent and an agent in a particular environment.

Figure 7:
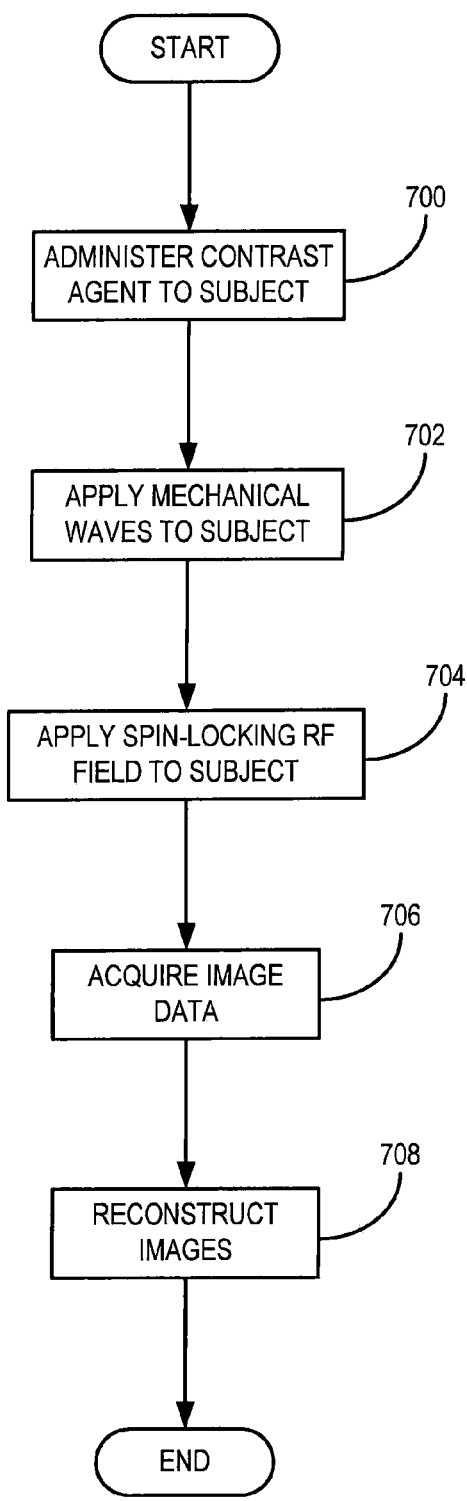
FIG. 7 is a flowchart setting forth the steps of a method for producing an image having an image contrast indicative of an MR contrast agent that is further enhanced in accordance with the present invention.

Referring particularly now to FIG. 7, a method for enhancing the effects of an MR contrast agent includes first administering said contrast agent to a subject, as indicated at step 700. Exemplary contrast agents include iron oxide-based contrast agents, such as superparamagnetic iron oxide ("SPIO") and ultrasmall superparamagnetic iron oxide ("USPIO") contrast agents; and gadolinium and manganese chelated contrast agents. After the contrast agent has been administered to the subject mechanical waves are applied to the subject, as indicated at step 702. For example, an ultrasound transducer may be utilized in connection with the MRI system described above with respect to FIG. 3 to impart mechanical waves to the subject, or an MRE driver device can be employed in connection with the MRI system described above with respect to FIG. 1. As the mechanical waves are be applied to the subject, imaging begins.

Similar to those methods described above, a pulse sequence such as the one described above with respect to FIG. 4 is employed to first apply a spin-locking RF field to the subject, as indicated at step 704. The resonance frequency of this spin-locking RF field is matched with the frequency of the applied mechanical waves, such that local magnetic field fluctuations produced by the oscillatory motion imparted to the subject at the matched frequency produce rotary saturation in the detected MR signals. More particularly, the mechanical wave frequency is selected such that the administered contrast agent experiences oscillatory displacements at the spin-locking RF field resonance frequency. In this manner, the rotary saturation effect is substantially restricted to the contrast agent and not the surrounding tissues, thereby resulting in an amplification of the contrast agent's effect. For example, where a SPIO contrast agent originally resulted in a loss of signal intensity due to $T_2$ relaxation, further signal attenuation is present as a result of the added effect of rotary saturation. Image data is subsequently acquired, as indicated at step 706, and reconstructed in the usual fashion to produce images of the subject, as indicated at step 708. These images provide an enhanced contrast mechanism due to the effect of rotary saturation on the already signal altering properties of the administered contrast agent.

Magnetic Resonance Acoustic Spectroscopy

Figure 8:
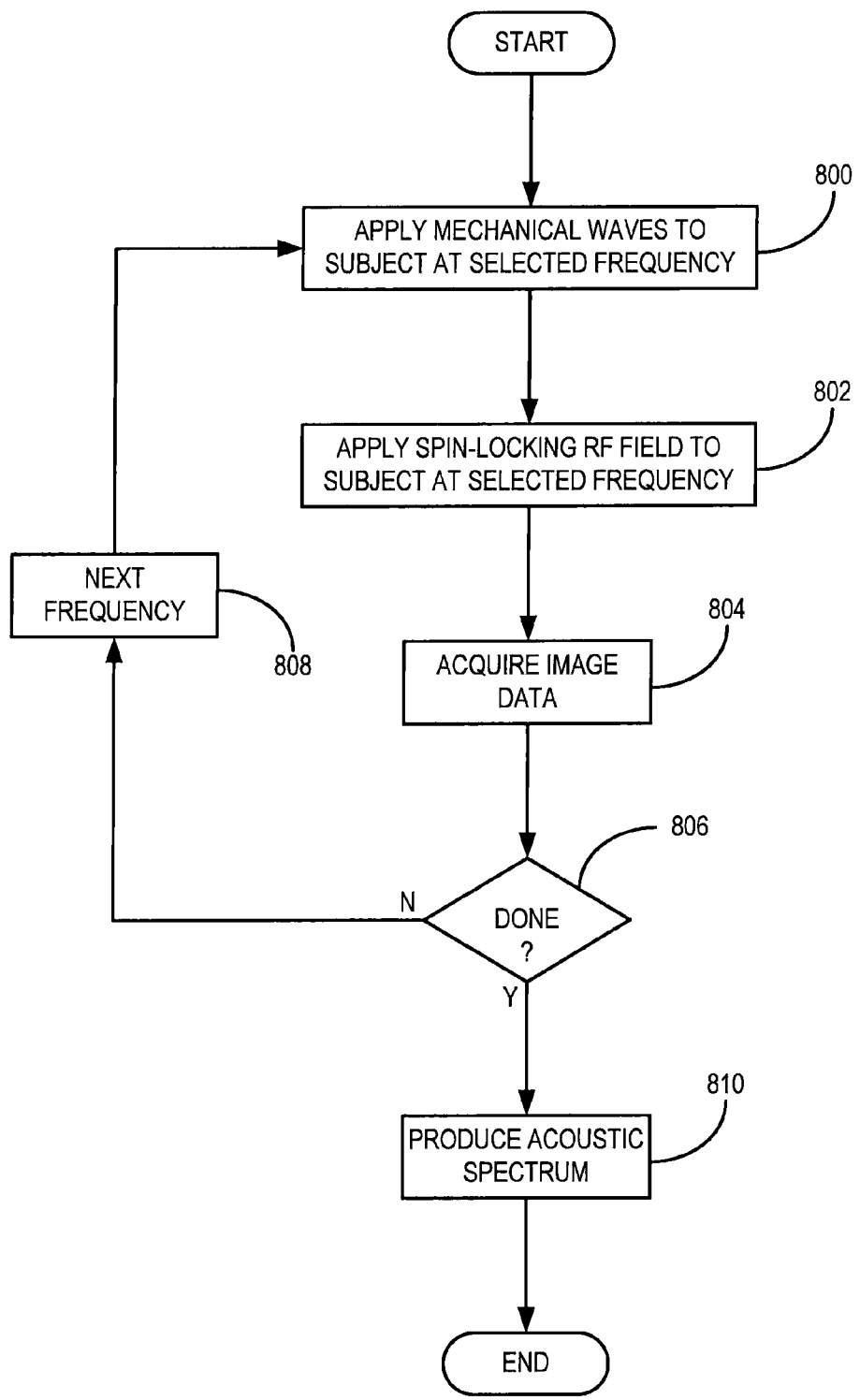
FIG. 8 is a flowchart setting forth the steps of a method for acoustic spectroscopy in accordance with the present invention.

Referring particularly now to FIG. 8, a method of so-called "acoustic spectroscopy" of a region in a subject, in which the mechanical properties of the region are interrogated at a plurality of mechanical wave frequencies, begins by applying a mechanical wave field to the subject, as indicated at step 800. The mechanical wave field can similarly be applied to an object so that acoustic spectroscopy is performed as a means for non-destructive testing of said object. Similar to those methods described above, a pulse sequence such as the one described above with respect to FIG. 4 is employed to first apply a spin-locking RF field to the subject, as indicated at step 802. The resonance frequency of this spin-locking RF field is matched with the frequency of the applied mechanical waves, such that local magnetic field fluctuations produced by the oscillatory motion imparted to the subject at the matched frequency produce rotary saturation in the detected MR signals. Image data is subsequently acquired, as indicated at step 804.

A decision is made at decision block 806 as to whether the desired amount of image data has been acquired. If not, the process loops back by first changing the frequency at which the mechanical waves and spin-lock RF field are applied, as indicated at step 808. When all of the desired frequencies have been swept through, and the corresponding image data acquired, an acoustic spectrum is produced next, as indicated at step 810. Each unique combination of particle mass and local Young's modulus produce a "spectral" peak. Therefore, sweeping the mechanical wave frequency along with the appropriately tuned rotary saturation sequence provides a form of spectroscopy that differentiates between different mechanical environments. Conversely the spectrum can differentiate different contrast agents (by mass), or different cellular structures if the magnetic object is endogenous.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing an image of a subject with a magnetic resonance imaging (MRI) system, the steps comprising:
   a) applying mechanical waves to the subject to produce oscillatory motion therein at a selected frequency;
   b) applying, to the subject and with the MRI system, a spin-lock radiofrequency (RF) pulse having a frequency matched with the selected frequency of the produced oscillatory motion;
   c) acquiring, with the MRI system, image data from the subject; and
   d) reconstructing, from the acquired image data, an image indicative of the mechanical waves applied to the subject.

2. The method as recited in claim 1 in which step b) includes:
   i) applying a first RF excitation pulse that tips longitudinal magnetization to a transverse plane prior to establishing a spin-lock condition with the spin-lock RF pulse; and
   ii) applying a second RF excitation pulse that tips the transverse spin magnetization back to longitudinal spin magnetization after the established spin-lock condition.

3. The method as recited in claim 2 in which step b) includes applying the spin-lock RF pulse for a time period sufficiently long to enable magnetic field fluctuations produced by the oscillatory motion produced in step a) to affect magnetic resonance signals from which image data is acquired in step c).

4. The method as recited in claim 3 in which the magnetic field fluctuations affect the magnetic resonance signals by at least one of inducing saturation of transverse magnetization in the spin-lock condition and rotating spin-locked magnetization away from a spin-lock RF field.

5. The method as recited in claim 1 in which the mechanical waves are continuously applied to the subject in step a) and steps b)-d) are repeated to produce a plurality of images.

6. The method as recited in claim 5 in which the mechanical waves applied in step a) are focused ultrasound waves.

7. The method as recited in claim 6 in which the plurality of images are produced substantially in real-time and are indicative of the location and extent of the applied focused ultrasound waves.

8. The method as recited in claim 1 in which the mechanical waves applied in step a) are focused ultrasound waves and are applied at a low power.

9. The method as recited in claim 8 further including updating a focused ultrasound treatment plan using the image reconstructed in step d).

10. The method as recited in claim 9 in which step e) includes adjusting at least one of an amplitude and phase of the applied focused ultrasound waves.

11. The method as recited in claim 1 further including administering a contrast agent to the subject before applying the mechanical waves in step a).

12. The method as recited in claim 11 in which the mechanical waves applied in step a) are at least one of acoustic waves, ultrasound waves, and focused ultrasound waves.

13. The method as recited in claim 12 in which the mechanical waves applied in step a) induce oscillatory motion at a selected frequency in substantially only the administered contrast agent.

14. The method as recited in claim 1 in which steps a)-c) are repeated to acquire a plurality of image data sets while the frequency of the oscillatory motion produced in step a) and spin-lock RF field applied in step b) are stepped through a plurality of values.

15. The method as recited in claim 14 further including producing, using the acquired plurality of image data sets, at least one acoustic spectrum indicative of the mechanical properties of a region in the subject.

* * * * *